US012217102B2

(12) United States Patent
Varadarajan et al.

(10) Patent No.: US 12,217,102 B2
(45) Date of Patent: Feb. 4, 2025

(54) DISTRIBUTED MECHANISM FOR FINE-GRAINED TEST POWER CONTROL

(71) Applicant: TEXAS INSTRUMENTS INCORPORATED, Dallas, TX (US)

(72) Inventors: Devanathan Varadarajan, Allen, TX (US); Varun Singh, McKinney, TX (US); Jose Luis Flores, Richardson, TX (US); Rejitha Nair, Southlake, TX (US); David Matthew Thompson, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 513 days.

(21) Appl. No.: 17/551,011

(22) Filed: Dec. 14, 2021

(65) Prior Publication Data

US 2023/0185633 A1 Jun. 15, 2023

(51) Int. Cl.
*G06F 9/50* (2006.01)
*G06F 11/30* (2006.01)
*G06F 11/32* (2006.01)

(52) U.S. Cl.
CPC .......... *G06F 9/5094* (2013.01); *G06F 9/5016* (2013.01); *G06F 11/3086* (2013.01); *G06F 11/321* (2013.01)

(58) Field of Classification Search
CPC .. G06F 9/5094; G06F 9/5016; G06F 11/3086; G06F 11/321; G06F 11/2242; G06F 11/27; G11C 29/02; G11C 29/83; G11C 2029/0401; G11C 2029/0403; G11C 29/16; G11C 29/4401; G11C 29/56008; G11C 29/14; Y02D 10/00
See application file for complete search history.

(56) References Cited

U.S. PATENT DOCUMENTS

| | | | |
|---|---|---|---|
| 11,144,696 B1* | 10/2021 | Sul | G06F 11/261 |
| 2003/0120974 A1 | 6/2003 | Adams et al. | |
| 2004/0006729 A1 | 1/2004 | Pendurkar | |
| 2017/0193154 A1* | 7/2017 | Sul | G01R 31/318364 |
| 2019/0162782 A1* | 5/2019 | Shanbhogue | G01R 31/31721 |
| 2020/0278395 A1* | 9/2020 | Herd | G01R 31/31724 |
| 2024/0012673 A1* | 1/2024 | Garbett | G06F 11/0721 |

OTHER PUBLICATIONS

Extended European search report, dated May 22, 2023, issued by the European Patent Office (8 pages).

\* cited by examiner

*Primary Examiner* — Sisley N Kim
(74) *Attorney, Agent, or Firm* — Michael T. Gabrik; Frank D. Cimino

(57) ABSTRACT

An integrated circuit comprises a set of processor cores, wherein each processor core of the set of processor cores includes BIST logic circuitry and multiple memory blocks coupled to the BIST logic circuitry. Each processor core further includes multiple power control circuitry, where each power control circuitry of the multiple power control circuitry is coupled to a respective processor core of the set of processor cores, multiple isolation circuitry, where each isolation circuitry of the multiple isolation circuitry is coupled to a respective processor core of the set of processor cores, a built-in-self repair (BISR) controller coupled to the each of the set of processor cores, each of the multiple power control circuitry, and each of the multiple isolation circuitry, and a safety controller coupled to the BISR controller, the multiple power control circuitry, and to the multiple isolation circuitry.

20 Claims, 6 Drawing Sheets

DISTRIBUTED MECHANISM FOR FINE-GRAINED TEST POWER CONTROL

BACKGROUND

Modern electronic integrated circuits integrate functional components of a computer system, whether general purpose or arranged for a particular end application, onto a single silicon semiconductor. These large-scale integrated circuits that include the computational capability for controlling and managing a wide range of function and useful applications are often referred to as "system on a chip" or "SoC" devices. Typically, modern SoC architectures include embedded memory blocks and one or more processor cores that carry out the digital computer functions of retrieving executable instructions from memory, performing arithmetic and logical operations on digital data retrieved from memory, and storing the results of those operations in memory. Other digital, analog, mixed-signal, or even RF functions may also be integrated into the SoC for acquiring and outputting the data processed by the processor cores. Considering the large amount of digital data that is involved in performing the complex functions of these modern devices, significant solid-state memory capability, including both volatile and non-volatile memory, is now implemented in these SoC devices.

To optimize performance, memory resources may be distributed throughout a modern SoC device. This distributed memory in a SoC architecture results in memory resources being physically (or logically) proximate to the processing function that will be accessing it. For example, the deployment of local memory resources in processor cores (embedded memory resources) reduces access time and memory management overhead. In some instances, embedded memory resources are not accessible over a system bus, but are only available to the processor cores in which it is realized, and therefore logic circuits are used to test these memory resources. For instance, these SoC devices may include internal test circuity (e.g., "built-in self-test" (BIST) circuitry) that includes logic interfaces for testing the embedded memory resources.

SUMMARY

In accordance with at least one example of the disclosure, an integrated circuit comprises a set of processor cores, wherein each processor core of the set of processor cores includes BIST logic circuitry and multiple memory blocks coupled to the BIST logic circuitry. Each processor core further includes multiple power control circuitry, where each power control circuitry of the multiple power control circuitry is coupled to a respective processor core of the set of processor cores, multiple isolation circuitry, where each isolation circuitry of the multiple isolation circuitry is coupled to a respective processor core of the set of processor cores, a built-in-self repair (BISR) controller coupled to the each of the set of processor cores, each of the multiple power control circuitry, and each of the multiple isolation circuitry, and a safety controller coupled to the BISR controller, the multiple power control circuitry, and to the multiple isolation circuitry.

In accordance with at least one example of the disclosure, a method executing BIST memory testing of an integrated circuit, includes receiving, by a BISR controller, multiple test power control scenarios from a safety controller, wherein the multiple test power control scenarios is associated with the BIST memory testing of a set of processor cores and comprises a hierarchical order of applying one or more test power control scenarios to the set of processor cores; dynamically applying, by the BISR controller, the one or more test power control scenarios on the set of processor cores according to the hierarchical order; performing, by a processor core of the set of processor cores, the BIST memory testing of an memory block associated with each of the set of processor cores; receiving, by the BISR controller, a result of the BIST memory testing of the memory block from the processor core; and sending, by the BISR controller, the result of the BIST memory testing to the safety controller.

BRIEF DESCRIPTION OF THE DRAWINGS

For a detailed description of various examples, reference will now be made to the accompanying drawings in which.

DETAILED DESCRIPTION

Figure 1:
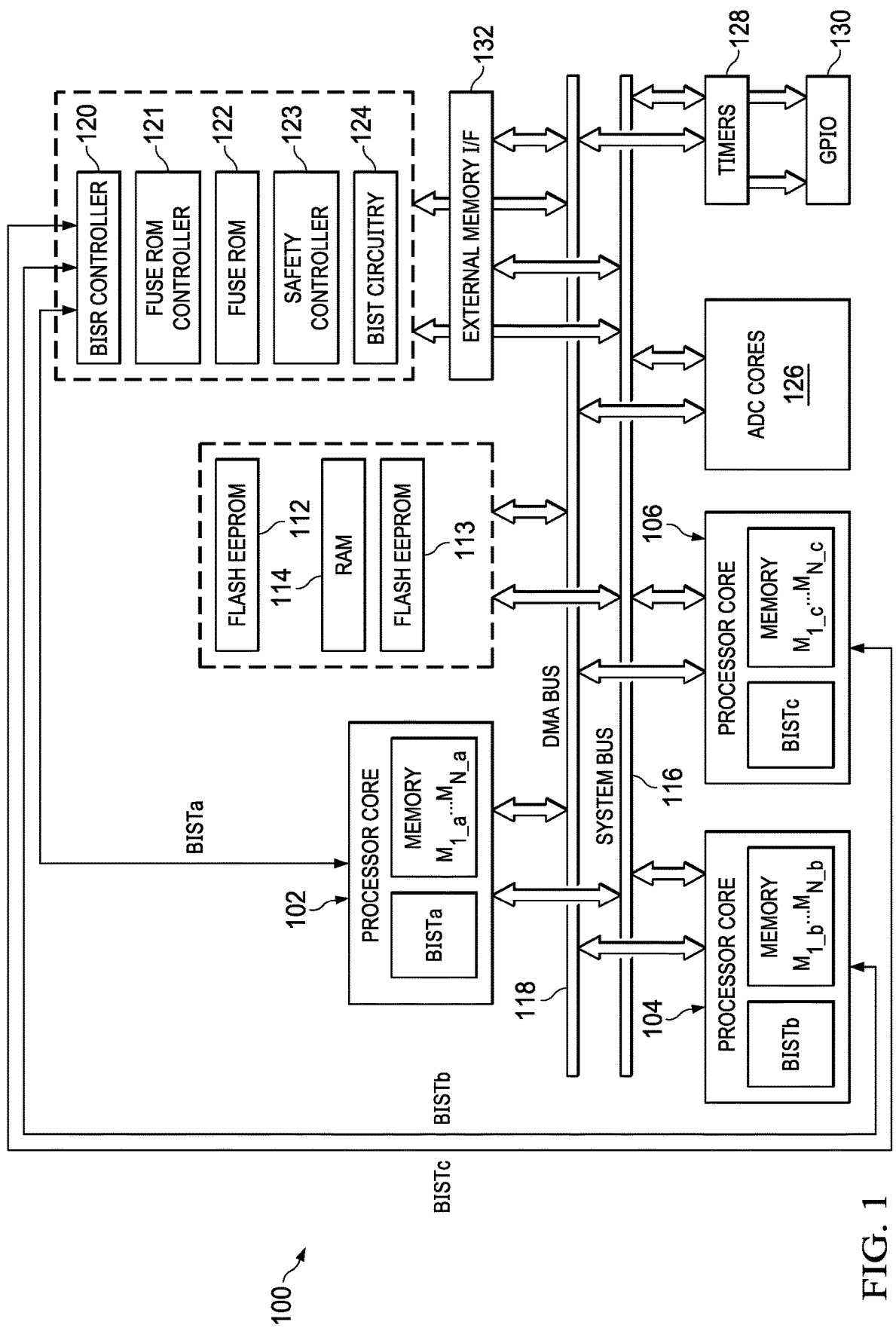
FIG. 1 is a block diagram of an integrated circuit in accordance with various examples.

In many modern SoC devices, embedded memory resources (e.g., embedded memory blocks) occupy a majority of the chip area of the SoC device and, in some cases, occupies as much as 70% of the total chip area. Continuing improvements in manufacturing technology have enabled the implementation of a wide number and variety of functional units into a single SoC. These functional units are often in the form of a block of programmable or custom logic circuitry, along with embedded memory blocks, which are commonly referred to as processor cores or "intellectual property cores" (or "IPs," for short).

The SoC may include a general-purpose test controller that is programmed by a set of instructions to implement BIST testing for the various internal and embedded functions of the processor cores, and to receive and log responses of those functions from BIST testing. Some BIST testing techniques include the placement of hardwired logic in the SoC, such as a general-purpose test controller in which memory test algorithms ("BIST program/test routines") are implemented on the embedded memory blocks. The test controller executes BIST operations or program routines for the SoC at the time of manufacture and also on power-up during a reset/reboot. The test controller exports data obtained from the BIST operation using a BIST datapath, which is BIST logic circuitry used for sending BIST data for analysis. A BIST testing technique includes executing a BIST program routine that includes writing of a desired data pattern to an embedded memory, and then addressing the memory to retrieve and compare the stored data to the expected data.

In an embedded memory context, built-in self-repair (BISR) circuitry such as a BISR controller (e.g., a general-purpose test controller discussed herein) is common in large scale integrated circuits and constitutes an interface between the BIST datapath and redundancy logic (such as fuses). The BISR controller determines whether embedded memory blocks have to be repaired based on the results of BIST program routines that are implemented on the memory blocks, and if so, determines the mapping of the repair entities in place of the failed cells using the fuses. The BIST datapath is a feature of the SoC and is a separate and independent datapath to test and retrieve data from the embedded memory blocks under test and which are different from that by which the embedded memory blocks are accessed in normal operation of the SoC (such as when functional operations are performed by the SoC based on programmed algorithms). In this regard, the BISR circuitry includes built-in repair analysis (BIRA) logic that receives the failure information for each repairable memory from the BIST circuitry, and that allocates the repair entities for those embedded memory blocks according to the redundancy analysis.

A BIST memory test is a test that may be performed on an embedded memory block of a processor core during manufacturing or during a system test (such as during power ON or reboot of a SoC in an automobile). When the SoC is implemented in an automobile in the field, a system test is a BIST memory test that is performed upon key on (e.g., a test mode upon powering ON the SoC). Within the manufacturing environment, BIST testing is intended to replicate the memory testing that is implemented in the field. For instance, in BIST testing, signals are applied to various processor cores in the SoC and BIST program routines are implemented to identify fault memory blocks. These faulty blocks may be associated with components in an automobile. As more memory blocks are added to an SoC, reducing test time is a factor during manufacturing testing. Additional logic interfaces are added in the SoC in order to reduce test time, which may result in a larger silicon area of the SoC that utilizes memory testing logic as well increases the power consumed by the SoC during BIST testing. As discussed above, embedded memory blocks occupy a majority of the chip area in a SoC and the power consumed while performing BIST testing may be higher than the actual power when functions of the SoC are performed/implemented during normal operation. Reducing test time may be achieved by implementing parallel testing of the embedded memory blocks whereby additional logic gates (e.g., multiple BIST datapaths and BISR controller) may be added to the SoC for the BIST testing. However, implementing parallel testing may see an increase in test power during BIST testing as well as an increase in size of the SoC to accommodate the additional logic gates for the BIST testing. Further, BIST testing may cause an instantaneous current (or high peak power) during test-mode entry resulting in higher silicon losses during manufacturing.

Disclosed herein are examples of BIST architectures for a SoC that are arranged with a BISR controller for measuring test power of memory blocks in a set of processor cores of the SoC during BIST testing. In an example the SoC is configured with a distributed architecture whereby each of the set of processor cores is coupled to independent power control circuitry and isolation control circuitry. The BIST testing is implemented with one or more test power control scenarios where each test power control scenario includes a different test condition. In an example, each test power control scenario is programmed with test conditions for obtaining an expected test power measurement of a processor core. In an example, the SoC includes power control circuitry and isolation control circuitry that may receive commands/signals from a safety controller while a test power control scenario is implemented during BIST testing. In an example, power gating and clock gating signals are applied to memory blocks of one or more processor cores to set the test conditions for the memory blocks of the processor cores. In an example, the power gating signals and clock gating signals are selectively controlled to implement coarse-grained and fine-grained tuning of the test conditions during BIST testing. In examples, each test power control scenario maps the address ranges of memory blocks that are being tested to 1) a first subset of processor cores that are to be powered (e.g., apply power) and that are clocked (e.g., receive clock signals) and includes the processor core(s) where the memory blocks are being tested; 2) a second subset of processor cores that are to be powered but not clocked (e.g., do not receive clock signals); and 3) a third subset of processor cores that are not powered or not clocked. In examples, commands/signals to apply a test power control scenario may be sent by a safety controller on the SoC or may be sent to the safety controller by external test equipment coupled to the safety controller. In an example, each test power control scenario may be programmed in the safety controller or the test equipment. In an example, the distributed architecture of the SoC is aligned to a central BIST infrastructure where each of the set of processor cores is coupled to a BISR controller for receiving and analyzing BIST data from each of the processor cores that is obtained during BIST testing. Implementing a common BISR controller coupled to each processor core for BIST testing may reduce the size of the SoC resulting from eliminating the additional test circuitry (e.g., a dedicated BISR controller for each memory block) that is used for BIST testing. Also, selectively controlling the processor cores during a test power control scenario and prior to BIST testing reduces the measured test power of the SoC without adding increasing the size of the SoC.

FIG. 1 is a block diagram of an integrated circuit that is constructed as a SoC 100 in accordance with various examples. In an example, the SoC 100 includes a BIST architecture for BIST testing and includes multiple processor cores 102, 104, 106, non-volatile memory arrays such as, for example, flash electrically erasable programmable read only memory (EEPROM) 112, 113, random access memory (RAM) 114, system bus 116, direct memory access (DMA) bus 118, BISR controller 120, fuse read-only memory (ROM) controller 121, fuse ROM 122, safety controller 123, BIST circuitry 124, analog-to-digital converter (ADC) cores 126, timers 128, general purpose input/output (GPIO) interface 130, and external memory interface (I/F) 132.

The SoC 100 may be designed for any desired function, and the multiple processor cores 102-106 may implement that function. In an example, flash EEPROM 112, 113, RAM 114, BISR controller 120, fuse ROM 122, BIST circuitry 124, ADC cores 126, timers 128, GPIO interface 130, and external memory I/F 132 are coupled to the processor cores 110-106 via system bus 116 and DMA bus 118 so as to be accessible to processor cores 110-106 and to one another. In an example, the SoC 100 is configured to implement a system test and/or a manufacturing test on the processor cores 102-106 using signals/instructions that are received from a safety controller 123, external automatic test equipment (ATE), and/or BISR controller 120. In an example, the safety controller 123 sends instructions to implement one or more BIST program routines as part of BIST testing during one or more test power control scenarios/modes. In an example, power gating signals and clock gating signals are applied to the embedded memory blocks of the processor cores 102-106 in a predefined and hierarchical order that independently and selectively control the power applied to the memory blocks and the clocks applied to the memory blocks of the processor cores 102-106, which reduces the test power consumed by the SoC 100 during the BIST testing.

In an example, the processor cores 102-106 carry out various programmable arithmetic and logic functions as appropriate for the end application of the SoC 100. Examples of the various processor cores 110-106 include a central processing unit (CPU), a digital signal processor (DSP), a specific programmable processor like a graphics processing unit (GPU), or other application-specific or customized logic, fixed sequence generators, and the like. For purposes of this description, each of these processor cores 102-106 constitute a block of programmable or custom logic circuitry in combination with embedded memory resources (e.g., embedded memory blocks) $M_1$-$M_N$. According to this example, the memory blocks $M_1$-$M_N$ of each processor core 102-106 may be realized as RAM for data storage, flash or other non-volatile memory for storage of data or program instructions, or a combination of these memory types.

In an example, BISR controller 120 is coupled to logic interfaces in each processor core 102-106. In an example, BISR controller 120 is coupled to processor cores 102-106 via respective BIST datapaths BISTa, BISTb, BISTc. In an example, the memory blocks $M_1$-$M_N$ may not be directly accessible via system bus 116 or DMA bus 118 but may be testable only by embedded BIST circuitry (e.g., an embedded BIST datapath) and communicate only via the corresponding BIST datapath. In examples, the embedded BIST datapaths include BISTa of processor core 102, BISTb of processor core 104, and BISTc of processor core 106. These BIST datapaths BISTa, BISTb, and BISTc correspond to the BIST interfaces over which BIST data is exported to BISR controller 120 or another test equipment/circuitry. In an example, BIST data is obtained based on program routines that are executed by a respective processor core 102-106 on memory blocks $M_1$-$M_N$. In an example, BIST datapaths BISTa, BISTb, BISTc are physically separate from the DMA bus 118 and the system bus 116 and are configured to communicate BIST data to the BISR controller 120 during BIST testing. In another example, the BIST datapaths BISTa, BISTb, BISTc are configured to communicate the BIST data over the system bus 116 and/or the DMA bus 118 based on a time-division access of the system bus 116 and/or the DMA bus 118 during BIST testing (e.g., when the processor core is not accessible to execute a functional operation).

In an example, BISR controller 120 applies BIST program routines while power gating signals and clock gating signals are applied by safety controller 123 or automatic test equipment (not shown) according to one or more test power control scenarios that are stored in safety controller 123 or automatic test equipment. In an example, each test power control scenario includes programmed test conditions for the embedded memory blocks $M_1$-$M_N$ that are implemented on processor cores prior to applying BIST testing on the memory blocks of the processor cores 102-106 as BIST program routines, for example, for a system test or a manufacturing test in a hierarchical order. In an example, each test power control scenario includes a different test condition that is applied prior to testing of the processor cores in the hierarchical order. In an example, BISR controller 120 receives BIST data over BISTa, BISTb, and BISTb resulting from execution of BIST program routines and self-test routines executed on the embedded memory blocks $M_1$-$M_N$ within a respective processor core 102-106. In an example, each of BISTa, BISTb, and BISTc obtains BIST data based on BIST program routines for a pass/fail determination of each of the memory blocks $M_1$-$M_N$ within a processor core 102-106 and exports it to BISR controller 120 for repair analysis. In an example, the pass/fail determination includes determining parametric faults and/or a random defects of memory cells in a memory block based on an expected output of the memory block. BISR controller 120 includes circuitry for embedded memory blocks $M_1$-$M_N$ in processor cores 102-106 to produce a fail signature indicating those bit locations, if any, that failed the BIST program routine. BISR controller 120 determines whether repair is necessary based on the results of the self-test program routines, and if so, determines the mapping of the repair entities in place of the failed cells. In an example, the BISR controller 120 of SoC 100 may include built-in repair analysis (BIRA) logic that receives the failure information for each repairable memory via BISTa, BISTb, and BISTb, and allocates the repair entities for those memory blocks according to a redundancy analysis algorithm. The redundancy allocation is then forwarded to fuse ROM controller 121 for configuration of the "fuses" in fuse ROM 122 according to the allocation.

In an example, processor cores 102-106 are "portable" in the sense that each processor core 102-106 may be placed, as a whole, in an integrated circuit layout for providing a particular desired function, and are "reusable" in the sense that the same processor core may be used in different overall SoC architectures. The particular form in which a given processor core 102, 104, 106 is defined can also vary; "soft" cores are in the form of synthesizable data according to a hardware description language or gate-level "netlist," while "hard" cores are defined as a low-level physical description or actual integrated circuit layout. In an example, the processor cores 102-106 (e.g., IP cores) may originate from different vendors and of different functional and BIST architectures, to reside within the same large-scale integrated circuit.

Other memory resources may also reside in SoC 100, for example, as shown by flash EEPROM 112, 113, and RAM 114. Each of the flash EEPROM 112, 113, and RAM 114 are accessible over the system bus 116 or DMA bus 118. While flash EEPROM 112, 113, and RAM 114 are shown as unitary blocks, these memory resources may, in an example, be realized as multiple memory blocks. Various memory cell types and arrangements may be used to implement flash EEPROM 112, 113, and RAM 114. For example, RAM 114 may be realized by static RAM (SRAM), dynamic RAM (DRAM), or the like. In an example, flash EEPROM 112, 113, and RAM 114 may be realized as flash memory, non-flash EEPROM memory, mask-programmable ROM, one-time programmable (OTP) ROM, and the like. In addition, individual instances of memory resources may have any one of a number of access architectures, including single-port and multi- port access for RAM 114.

In an example, other BIST circuitry 124 may be provided in SoC 100. In an example, BIST isolation circuitry 124 couples the processor cores 102-106 to the BIST datapaths BISTa, BISTb, and BISTb. In an example, BIST circuitry 124 may initiate and evaluate self-test routines for circuitry outside of those functions that include their own embedded BIST datapaths (e.g., other than BISTa, BISTb, and BISTb in processor cores 102-106), in an example, at power-up of SoC 100. BISR controller 120 may also receive data corresponding to the contents of flash EEPROM 112, 113, and 114, such data including, for example, the results of routines executed by BIST circuitry 124 or test algorithms applied by external automated test equipment. Additionally, or in the alternative, BISR controller 120 may have an external interface so as to receive commands and expected data from automated test equipment (not shown), and to communicate test results in response. According to examples, BISR controller 120 is constructed to include a unified repair architecture for performing repair analysis for embedded memory blocks in processor cores 102-106, and also non-embedded memory blocks in SoC 100.

Various peripheral functions may also be provided in SoC 100. In an example, these peripherals include ADC cores 126, timers 128, and GPIO interface 130, each of which is coupled to system bus 116 and DMA bus 118 so as to be accessible to processor cores 102-106 and to one another. Other peripherals such as serial interfaces, network interfaces, various signal processing functions, and the like may also be included in SoC 100. SoC 100 also includes other functions such as external memory I/F 132, power circuitry, and clock circuitry, and other support functions. In a more general sense, the various memory blocks and other functions in the architecture of SoC 100 may not be physically realized in the arrangement shown in FIG. 1, but may instead be placed at various locations within the integrated circuit. In this regard, multiple instances of those memory blocks and other functions may in fact be physically and logically distributed throughout SoC 100. These and other variations in the arrangement of SoC 100 are included within the scope of this disclosure. In an example, the SoC 100 includes a single BISR controller 120 that is coupled to each processor core, which may reduce the size of SoC 100 for implementing BIST testing. Also, implementing the test power control scenarios during BIST testing reduces the measured test power of the SoC without increasing the size of the SoC.

Figure 2:
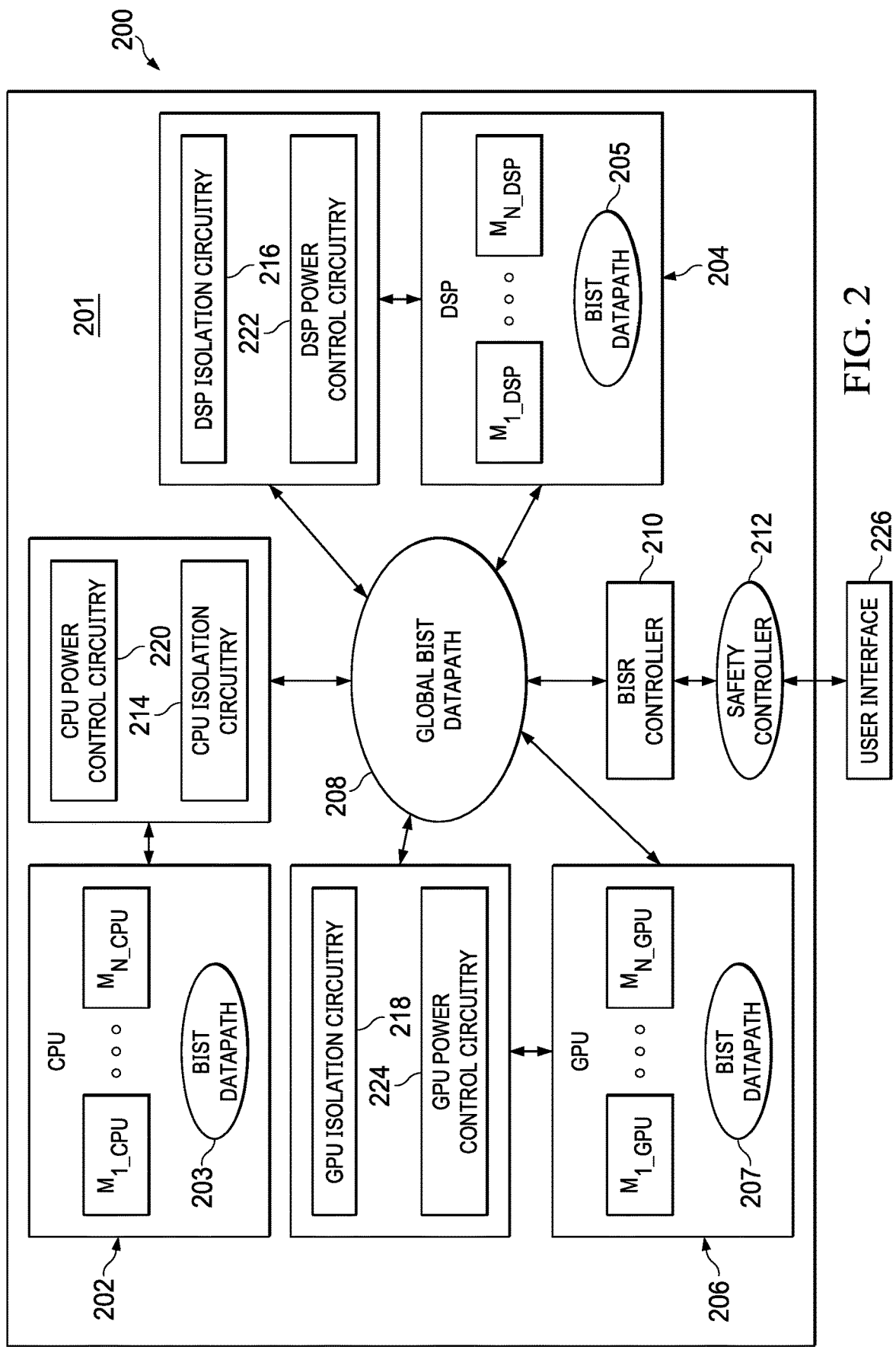
FIG. 2 is a block diagram of a portion of an architecture for a system test of an integrated circuit in accordance with various examples.

FIG. 2 is a block diagram of a portion of a distributed BIST architecture 200 of a SoC with multiple processor cores in accordance with various examples. In an example, the BIST architecture 200 includes SoC 201, which is an example of SoC 100 of FIG. 1. In an example, BIST architecture 200 implements a system test on SoC 201 according to one or more test power control scenarios.

As shown in FIG. 2, SoC 201 includes a CPU 202, BIST datapath 203, DSP 204, BIST datapath 205, GPU 206, BIST datapath 207, global BIST datapath 208, BISR controller 210, a safety controller 212, CPU isolation circuitry 214, DSP isolation circuitry 216, GPU isolation circuitry 218, and CPU power control circuitry 220, DSP power control circuitry 222, GPU power control circuitry 224, and user interface 226. CPU 202, DSP 204, GPU 206 are coupled to a global BIST datapath 208. BISR controller 210 is common to CPU 202, DSP 204, and GPU 206 and coupled to CPU 202, DSP 204, and GPU 206 via global BIST datapath 208 and to safety controller 212. In an example, SoC 201 is configured with a diversified architecture whereby independent power control circuitry and isolation control circuitry for each CPU 202, DSP 204, GPU 206 is coupled to its respective processor core (e.g., CPU, DSP, GPU, etc.). Further, the diversified architecture is aligned to a central BIST infrastructure whereby each of the CPU 202, DSP 204, and GPU 206 is coupled to a single BISR controller 210 whereby the BISR controller 210 receives and analyzes BIST data that is received from BIST datapaths on the CPU 202, DSP 204, GPU 206 according to test power control scenarios that are implemented by safety controller 212 prior to the BISR controller 210 implementing BIST testing.

While SoC 201 is shown with CPU 202, DSP 204, GPU 206, additional processor cores may be provided as a matter of design choice.

In an example, the processor cores of SoC 201 may each include embedded memory blocks $M_1$-$M_N$ and an embedded BIST datapath dedicated to the embedded memory blocks $M_1$-$M_N$ of its respective processor core. In an example, CPU 202 includes BIST datapath 203 and embedded memory blocks $M_{1\_CPU}$-$M_{N\_CPU}$, DSP 204 includes BIST datapath 205 and embedded memory blocks $M_{1\_DSP}$-$M_{N\_DSP}$, and GPU 206 BIST datapath 207 and embedded memory blocks $M_{1\_GPU}$-$M_{N\_GPU}$. Each of the embedded memory blocks $M_1$-$M_N$ of the CPU 202, DSP 204, and GPU 206 comprises a plurality of addressable memory locations, that is mapped to redundant memory locations/redundant memory cells (e.g., fuse ROM 122 in FIG. 1) that are available to replace faulty addressable memory locations based on a parametric fault or a random defect when a system test is implemented on SoC 201. In an example, BIST datapaths 203, 205, 207 correspond to the BIST interfaces over which BIST data is exported from CPU 202, DSP 204, GPU 206 respectively to BISR controller 210 via BIST datapath 208. In an example, CPU 202, DSP 204, GPU 206 export BIST data to BISR controller 210 when one or more test power control scenarios is executed by BISR controller 210.

In an example, each processor core is coupled to isolation circuitry and power control circuitry that is distributed through the SoC 201. For example, CPU 202 is coupled to CPU isolation circuitry 214 and CPU power control circuitry 220, DSP 204 is coupled to DSP isolation circuitry 216 and BIST power control circuitry 222, and GPU 206 is coupled to GPU isolation circuitry 218 and GPU power control circuitry 224. In an example, safety controller 212 is coupled to BISR controller 210, CPU isolation circuitry 214, CPU power control circuitry 220, DSP isolation circuitry 216, DSP power control circuitry 222, GPU isolation circuitry 218, and GPU power control circuitry 224 and may send commands/instructions to the respective isolation circuitry and power control circuitry for setting test conditions on CPU 202, DSP 204, and GPU 206 when a BIST memory test is initiated by safety controller 212. In an example, a user may send an instruction/signal to safety controller 212 via user interface 226 for setting test conditions on CPU 202, DSP 204, and GPU 206 as part of a test power control scenario when a BIST memory test is initiated by user interface 226. In another example, safety controller 212 may execute operating routines relating to performing functional operations on the CPU 202, DSP 204, GPU 206 as appropriate for the end application of SoC 201.

In an example, CPU power control circuitry 220, DSP power control circuitry 222, and GPU power control circuitry 224 are distributed in the SoC 201 and arranged close to its respective processor core (e.g., CPU 202, DSP 204, GPU 206). In an example, safety controller 212 may be configured for fine-grained power gating or coarse-grained power gating. In an example, CPU power control circuitry 220, DSP power control circuitry 222, and GPU power control circuitry 224 may receive control signals from safety controller 212 via BISR controller 210 that applies power or removes power to the memory blocks of a processor core according to one or more test power control scenarios during BIST testing. For instance, safety controller 212 may instruct the BISR controller 210 to apply power gating signals to CPU power control circuitry 220, DSP power control circuitry 222, and GPU power control circuitry 224 that turn OFF power switches within CPU power control circuitry 220, DSP power control circuitry 222, and GPU power control circuitry 224. In an example, the safety controller 212 may instruct the BISR controller 210 to perform coarse-grained power gating or fine-grained power gating, or a combination of fine-grained power gating or coarse-grained power gating during BIST testing. In an example, the power gating signals may turn OFF the power switches to shut OFF the current that is applied to memory blocks of the CPU 202, the DSP 204, or the GPU 206. In an example, the power gating signals may be applied, during BIST testing, to a memory block in a processor while other memory blocks are not power gated (e.g., to perform fine-grained power gating) such that the memory block that is power gated does not receive current while other memory blocks that are not power gated receive current, which reduces the measured test power (e.g., measured leakage power). Further, in an example, a processor core may be power gated OFF where all memory blocks do not receive current (e.g., to perform coarse-grained power gating), while memory blocks in another processor core are not power gated OFF. In an example, applying coarse-grained power gating turns OFF the current to all memory blocks of a processor core and further reduces the measured test power of the SoC 201 during BIST testing.

In operation, the SoC 201 is configured to apply one or more test power control scenarios for reducing the measured test power (e.g., measured leakage power and measured dynamic power) of the processor cores of SoC 201. In an example, safety controller 212 may store one or more programmed test power control scenarios that include customized test power profiles for dynamic power and leakage power for the CPU 202, DSP 204, and GPU 206. In an example, each test power control scenario may be programmed in the safety controller 212 and may be applied during BIST testing that sets the test conditions for the CPU 202, DSP 204, and GPU 206. In an example, each test power control scenario is programmed with test conditions for obtaining an expected test power measurement of a processor core in the SoC 201. In an example, each test power control scenario may be stored or programmed as software instructions that may be executed by safety controller when a system test or a manufacturing test is initiated on the CPU 202, the DSP 204, and the GPU 206 or on an individual memory block of the CPU 202, the DSP 204, and the GPU 206.

In an example, the safety controller 212 may enable dynamic clock-gating of CPU 202, DSP 204, and GPU 206 whereby coarse-grained clock gating, fine-grained clock gating, or a combination of fine-grained clock gating or coarse-grained clock gating may be performed during BIST testing. For instance, the safety controller 212 may instruct the BISR controller 210 to send clock gating signals to the CPU 202, the DSP 204, and/or the GPU 206 to turn OFF the clocks that are applied to CPU 202, the DSP 204, and/or the GPU 206. In an example, the safety controller 212 may instruct the BISR controller 210 to send clock gating signals to BIST datapaths 203, 205, and 207 of respective CPU 202, DSP 204, and GPU 206 that causes a respective BIST datapath 203, 205, and 207 to turn OFF clock signals to non-tested embedded memory blocks of a processor core (e.g., one of CPU 202, DSP 204, and GPU 206) while one or more tested memory blocks in the processor core may receive clock signals (e.g., to perform fine-grained clock gating). In another example, the safety controller 212 may instruct the BISR controller to turn OFF clock signals to all memory blocks of a processor core (e.g., to perform coarse-grained clock gating) during BIST testing. In an example, during fine-grained clock gating, other memory blocks under test continue to receive clock signals during BIST testing. In an example, safety controller 212 may enable dynamic clock-gating of a memory-block under test whereby BISR controller 210 may instruct the BISR controller 210 to dynamically send signals to a non-tested memory block to clock gate OFF the memory block while a tested memory block receives clock signals. In an example, safety controller 212 may enable dynamic clock-gating of a processor core whereby the safety controller 212 may instruct the BISR controller 210 to turn OFF an embedded datapath of a processor core that is not-under-test by clock gating the embedded datapath to turn OFF the applied clock signals.

In an example, safety controller 212 may be configured for fine-grained isolation or coarse-grained isolation. In an example, the safety controller 212 may be configured to isolate memory blocks from other memory blocks within a processor core (e.g., fine-grained isolation) or isolate a processor core from other processor cores (e.g., coarse-grained isolation) by instructing BISR controller 210 to apply isolation control signals to CPU isolation circuitry 214, DSP isolation circuitry 216, and GPU isolation circuitry 218 that cause output values/states of logic gates in a memory blocks of CPU 202, DSP 204, or GPU 206 that receive the isolation signal to be at logic output value that is a safe value (e.g., turn ON BISR isolation). In an example, during fine-grained isolation control, the safety controller 212 may instruct BISR controller 210 to send isolation control signals to CPU isolation circuitry 214, DSP isolation circuitry 216, or GPU isolation circuitry 218 that causes output values/states of logic gates in a non-tested memory block of CPU 202, DSP 204, or GPU 206 to be at logic output value (e.g., logic zero value) whereby the non-tested memory block does not override the functional behavior (e.g., does not interfere with an output state of logic gates) in a tested memory block (e.g., output state at a "safe value"). In an example, during coarse-grained isolation control, the safety controller 212 may instruct BISR controller 210 to send isolation control signals to CPU isolation circuitry 214, DSP isolation circuitry 216, or GPU isolation circuitry 218 that causes output values/states of logic gates in all memory blocks of CPU 202, DSP 204, or GPU 206 to be at logic output value (e.g., logic zero value) whereby the CPU 202, DSP 204, or GPU 206 does not override the functional behavior of logic gates in a tested processor core (e.g., CPU 202, DSP 204, or GPU 206). In an example, safety controller 212 may selectively execute BIST program routines that selectively instructs BISR controller 210 to control clock gating and/or power gating of memory blocks in one or more processor cores that is not under test to ensure that the output state of logic gates in the memory blocks are at a safe value (e.g., a logic zero value) so as to not override the functional behavior of a memory block in CPU 202, DSP 204, and GPU 206 that is executing a BIST routine. Further, in an example, each CPU power control circuitry 220, DSP power control circuitry 222, and GPU power control circuitry 224 may be selectively controlled by the BISR controller 210 via safety controller 212 to apply clock-gating signals to an embedded datapath in a non-tested processor core to isolate the entire processor core from the BIST datapath. In an example disclosed herein, the SoC 201 includes a common BISR controller 210 that is coupled to each processor core and may reduce the size of SoC 100 for implementing BIST testing. Also, implementing the test power control scenarios during BIST testing reduces the measured test power of the SoC without increasing the size of the SoC.

Figure 3:
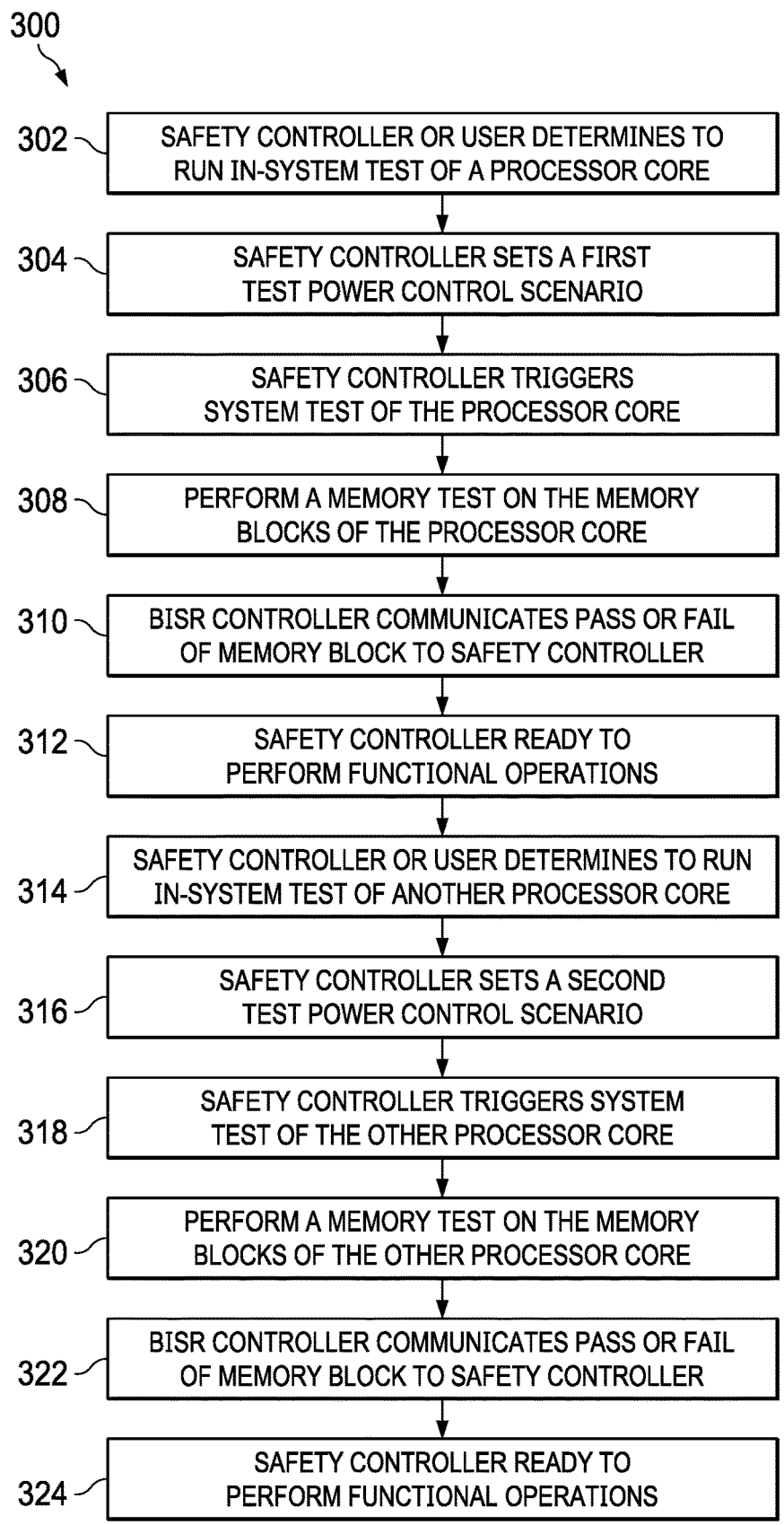
FIG. 3 is a flow diagram illustrating a system test of an integrated circuit in accordance with various examples.

FIG. 3 is a flow diagram illustrating a test method 300 on an integrated circuit in accordance with various examples. In an example, the test method 300 implements a system test on an integrated circuit with a BIST architecture, which in an example, is BIST architecture 200 that includes CPU 202, DSP 204, and/or GPU 206 of SoC 201 that was shown and described in FIG. 2. In an example, test method 300 implements a system test on SoC 201 using one or more test power control scenarios that sets test conditions on the SoC 201 that corresponds to one or more test power control scenarios during BIST testing of the SoC 201.

With continued reference to FIG. 2, in step 302, the safety controller 212 may determine to run a system test according to the BIST testing on a processor core. In an example, the safety controller 212 may determine to run a system test on CPU 202 according to programmed instructions that are stored or programmed in safety controller 212. In an example, the safety controller 212 may receive the programmed instructions from a user via user interface 226. The programmed instructions may include one or more test power control scenarios that causes the safety controller 212 to run BIST testing on the CPU 202, DSP 204, and GPU 206. In an example, the test power control scenarios may identify a hierarchical order for testing the CPU 202, DSP 204, and GPU 206 whereby the safety controller sends signals/instructions to the BISR controller 210 to apply power signals, clock signals, and isolation control signals to the processor cores after which the BISR controller 210 executes the BIST program routines according to the BIST testing to test the embedded memory blocks of CPU 202.

In an example, the safety controller 212 may execute functional instructions that perform operations associated with a function of the SoC 201 while the instructions to run a system test on CPU 202 is received. In an example, the safety controller 212 may initiate a system test by sending control signals to CPU 202, DSP 204, and/or GPU 206 to implement a system test on CPU 202 whereby clock gating signals and power gating signals are applied to the non-tested processor cores (e.g., DSP 204 and GPU 206) after which one or more BIST program routines is executed to test the memory blocks of CPU 202 (e.g., tested processor core).

In step 304, safety controller 212 sets a first test power control scenario for SoC 201. In an example, the first test power control scenario may be one of a plurality of test power control scenarios. In an example, safety controller 212 may set the first test power control scenario for CPU 202 by instructing BISR controller 210 to apply power gating signals and clock gating signals to CPU 202, DSP 204, and GPU 206 that set one or more test conditions on CPU 202, DSP 204, and GPU 206 as specified by the first test power control scenario. In an example, each test power control scenario in the plurality of test scenarios includes a different test condition for the CPU 202, DSP 204, and GPU 206 than another test power control scenario for the CPU 202, DSP 204, and GPU 206. In an example, the power gating signals and clock gating signals that are applied to the processor cores turn OFF clocks to a non-tested processor core or a memory block of a non-tested processor core, turn ON BISR isolation of a non-tested processor core or a memory block of a non-tested processor core, and/or turn OFF power to a non-tested processor core or a memory block of a non-tested processor core.

In an example, safety controller 212 instructs BISR controller 210 to send clock gating signals to BIST datapath 205 via global BIST datapath 208 that turn OFF clock signals to DSP 204 (e.g., clock gating the DSP 204) in order to prevent logic gates in the memory block of DSP 204 from receiving a clock signal that may cause the logic gates to switch output states.

In an example, safety controller 212 instructs BISR controller 210 to send isolation control signals to GPU isolation circuitry 218 via BIST datapath 208 to turn ON isolation of GPU 206 (e.g., turn ON GPU BISR isolation) whereby output states/values of the memory blocks $M_{1\_GPU}$-$M_{N\_GPU}$ in GPU 206 are at a safe value.

In an example, safety controller 212 instructs BISR controller 210 to send power gating signals to GPU power control circuitry 224 that turn OFF power to GPU 206 (e.g., power shut-off of GPU 206 by power gating the GPU 206) after turning ON GPU BISR isolation. In an example, power gating GPU 206 after turning ON GPU BISR isolation prevents output states of logic gates of memory block in GPU 206 from causing excessive leakage currents (e.g. possibly due to short circuits from turning OFF logic gates with a high output value).

In an example, after power gating GPU 206, safety controller 212 may enable fine-grained clock gating of each memory block among the memory blocks $M_{1\_CPU}$-$M_{N\_CPU}$ of CPU 202 by instructing the BISR controller 210 to perform dynamic clock gating of the memory blocks $M_{1\_CPU}$-$M_{N\_CPU}$ during a system test that reduces test power during BIST testing.

In step 306, safety controller 212 triggers a system test of processor core on SoC 201. In an example, the safety controller 212 may trigger the BISR controller 210 to send control commands/signals to CPU 202 to execute a system test that is performed by the CPU 202 according to one or more BIST program routines.

In step 308, BISR controller 210 performs a memory test on the memory blocks on the processor core. In an example, BISR controller 210 performs a fine-grained system test on the memory blocks $M_{1\_CPU}$-$M_{N\_CPU}$ within CPU 202 based on BIST program routines that are stored in and executed by CPU 202. In an example, for a fine-grained system test, the BISR controller 210 may dynamically clock gate memory blocks not-under-test to turn OFF clock signals to the non-tested memory blocks while a memory block under test is being tested. The BIST program routines include performing various operations (e.g., write and read) to serially test the memory blocks $M_{1\_CPU}$-$M_{N\_CPU}$ to determine whether one or more memory blocks $M_{1\_CPU}$-$M_{N\_CPU}$ has a parametric fault or a random defect based on an expected output of the memory blocks $M_{1\_CPU}$-$M_{N\_CPU}$.

In step 310, the BISR controller 210 sends a pass/fail determination to safety controller 212. In an example, BISR controller 210 obtains results of the BIST testing including a pass/fail determination for one or more cells in each memory block $M_{1\_CPU}$-$M_{N\_CPU}$ of CPU 202 based on BIST data that is received over BIST datapath 203. In an example, the BISR controller 210 sends the pass/fail determination to safety controller 212 via BIST datapath 208.

In step 312, the safety controller 212 is ready to perform functional operations of the SoC 201. In an example, safety controller 212 sends commands/signals to BISR controller 210 to reset/clear logic gates in the BIST datapath (e.g., BIST datapath 208 and BIST datapath 203) after the BIST data is received from CPU 202. In an example, after resetting the BIST datapaths 203 and 208, the safety controller 212 is ready to execute functional instructions for any desired operation associated with the functions of the SoC 201.

In step 314, the safety controller 212 may determine to run a system test on another processor core of SoC 201 such as, for example, DSP 204. In an example, the safety controller 212 may receive the programmed instructions from a user via user interface 226. In an example, safety controller 212 may send an instruction/signal to BISR controller 210 after system testing is completed on the memory blocks of CPU 202 or a user may send an instruction/signal to safety controller 212 via user interface 226 that causes the safety controller 212 to initiate the system test on DSP 204. In an example, the safety controller 212, or the user via the user interface 226, may determine to run a system test on DSP 204 according to programmed instructions that are stored or programmed in safety controller 212, or sent by the user. The programmed instructions may include one or more test power control scenarios that causes the safety controller 212 to run BIST testing on the DSP 204. In an example, the test power control scenarios may identify a hierarchical order whereby power signals, clock signals, and isolation control signals are applied by the BISR controller 210 to the processor cores after which the BISR controller 210 executes the BIST program routines according to the BIST testing to test the embedded memory blocks of DSP 204. In an example, the safety controller 212 may send test execution signals to BISR controller 210 while SoC 201 is powered ON (e.g., receiving power and clock signals) and while CPU 202, DSP 204, and GPU 206 are executing functional instructions for performing functional operations associated with the functions of SoC 201.

In step 316, safety controller 212 sets a second test power control scenario for DSP 204 of the SoC 201. In an example, safety controller 212 may set a test power control scenario for DSP 204 by instructing BISR controller 210 to apply power gating signals and clock gating signals to CPU 202, DSP 204, and GPU 206 that set one or more test conditions on CPU 202, DSP 204, and GPU 206 that is different than the first test power control scenario for CPU 202. In an example, safety controller 212 may instruct BISR controller 210 to send clock gating signals to processor cores via BIST datapath 208 that turn OFF clocks to a non-tested processor core or a memory block of a non-tested processor core, send isolation control signals that turn ON BISR isolation of a non-tested processor core or a memory block of a non-tested processor core, and power gating signals that turn OFF power to a non-tested processor core or a memory block of a non-tested processor core.

In an example, safety controller 212 may instruct BISR controller 210 to send clock gating signals to BIST datapath 203 via BIST datapath 208 that turn OFF clock signals to CPU 202 (e.g., clock gating CPU 202) in order to prevent logic gates in the memory block of CPU 202 from switching output states.

In an example, safety controller 212 may instruct BISR controller 210 to send isolation control signals to GPU isolation circuitry 218 via BIST datapath 208 that turn ON BISR isolation of GPU 206 (e.g., turn ON GPU BISR isolation).

In an example, safety controller 212 may instruct BISR controller 210 to send power gating signals to GPU power control circuitry 224 (e.g., power shut-off of GPU 206) that turn OFF power to GPU 206 after turning ON GPU BISR isolation. In an example, power gating GPU 206 after turning ON GPU BISR isolation prevents short circuits due to excessive leakage currents.

In an example, after power gating GPU 206, safety controller 212 may enable fine-grained clock gating on memory blocks of DSP 204 by instructing the BISR controller 210 to perform dynamic clock gating of the memory blocks $M_{1\_DSP}$-$M_{N\_DSP}$ during a system test.

In step 318, safety controller 212 triggers a system test of processor core on SoC 201. In an example, the safety controller 212 may trigger the BISR controller 210 to send commands to DSP 204 to execute a system test on DSP 204 according to one or more BIST program routines by sending commands/signals to the BISR controller 210.

In step 320, BISR controller 210 performs a memory test on the memory blocks on the processor core. In an example, BISR controller 210 performs a fine-grained system test on the memory blocks $M_{1\_DSP}$-$M_{N\_DSP}$ within DSP 204 based on BIST program routines that are stored in and executed by DSP 204. In an example, for a fine-grained system test, the BISR controller 210 may dynamically clock gate memory blocks not-under-test to turn OFF clock signals to the non-tested memory blocks while a memory block under test is being tested. The BIST program routines include performing various operations (e.g., write and read) to serially test the memory blocks $M_{1\_DSP}$-$M_{N\_DSP}$ to determine whether one or more memory blocks $M_{1\_DSP}$-$M_{N\_DSP}$ has a parametric fault and/or a random defect based on an expected output of the memory blocks $M_{1\_DSP}$-$M_{N\_DSP}$.

In step 322, the BISR controller 210 sends a pass/fail determination to safety controller 212. In an example, BISR controller 210 obtains a pass/fail determination for each of the memory blocks $M_{1\_DSP}$-$M_{N\_DSP}$ within DSP 204 based on the BIST data that is received over BIST datapath 205. In an example, the BISR controller 210 sends the pass/fail determination to safety controller 212 via BIST datapath 208.

In step 324, the safety controller 212 is ready to perform functional operations of the SoC 201. In an example, safety controller 212 sends commands/signals to BISR controller 210 to reset/clear logic gates in the BIST datapath (e.g., BIST datapath 208 and BIST datapath 205) after the BIST data is received from DSP 204. In an example, after resetting the BIST datapaths 205 and 208, the safety controller 212 is ready to execute functional instructions for any desired function associated with the functions of the SoC 201.

Figure 4:
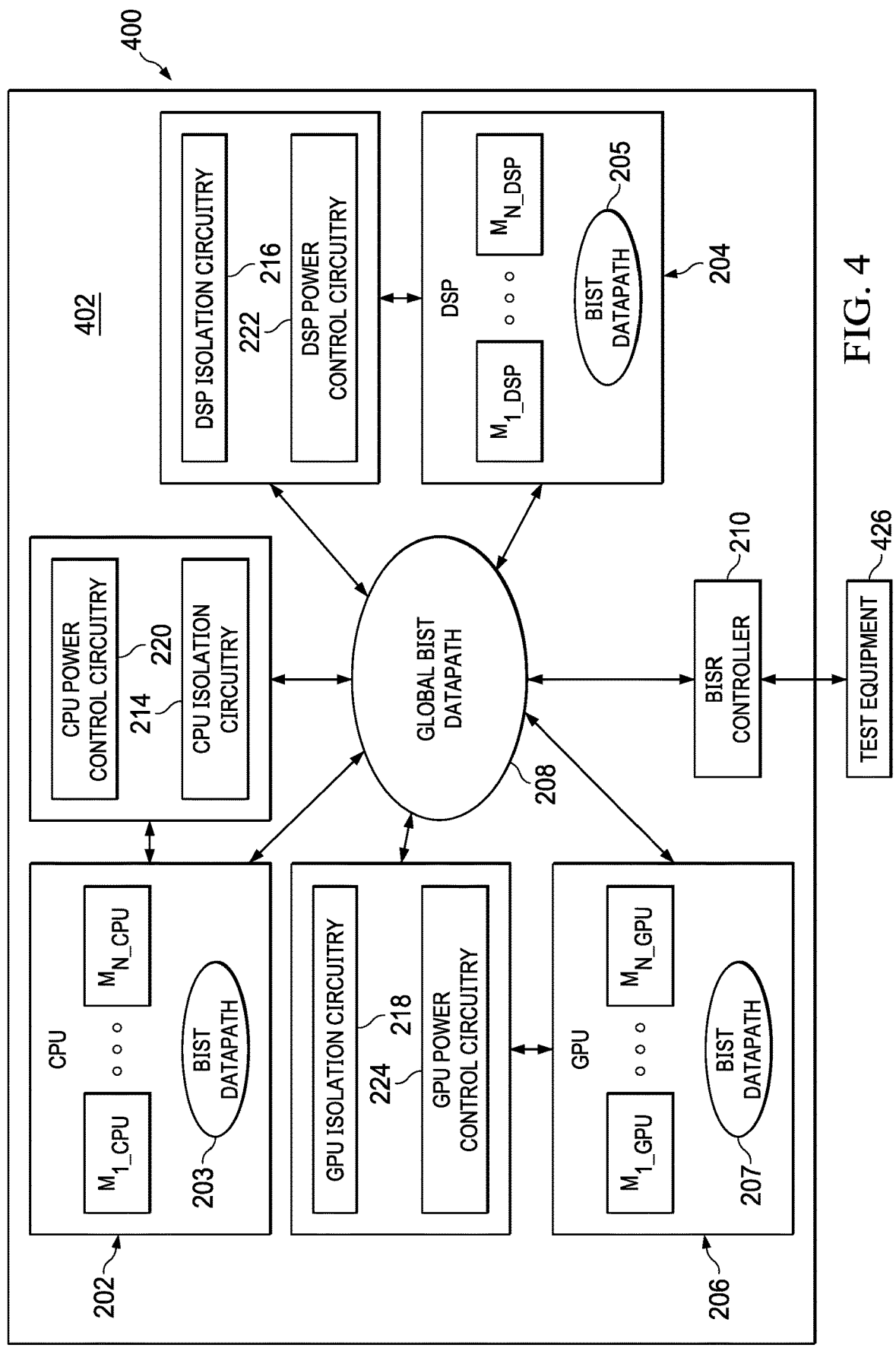
FIG. 4 is a block diagram of a portion of an architecture for a manufacturing test of an integrated circuit in accordance with various examples.

FIG. 4 is a block diagram of a portion of a distributed BIST architecture 400 of a SoC with multiple processor cores in accordance with another example. In an example, BIST architecture 400 includes a SoC 402 with substantially the same components as BIST architecture 200 but includes test equipment 426 instead of safety controller 212. In operation, test equipment 426 is coupled to BISR controller 210 and may send an instruction/signal to a respective processor core (e.g., CPU 202, DSP 204, and GPU 206) via the BISR controller 210 in a predefined hierarchical manner for setting test conditions on CPU 202, DSP 204, and GPU 206 when a BIST memory test is initiated by test equipment 426 and performed by BISR controller 210. In an example, test equipment 426 may send power gating signals to CPU power control circuitry 220, DSP power control circuitry 222, and GPU power control circuitry 224 to independently control the power applied to the memory blocks of a respective processor core CPU 202, DSP 204, and GPU 206 when a BIST memory test is initiated by test equipment 426. Also, in another example, test equipment 426 may send independent clock gating signals to BIST datapaths 203, 205, 207 to independently control the clock signals that are applied to the memory blocks of a respective processor core CPU 202, DSP 204, and GPU 206 when a BIST memory test is initiated by test equipment 426. In an example, the SoC 100 includes a common BISR controller 210 that is coupled to each processor core and may reduce the size of SoC 402 for implementing BIST testing. Also, the test equipment may apply the test power control scenarios during BIST testing, which reduces the measured test power of the SoC 402 without increasing the size of the SoC 402.

Figure 5:
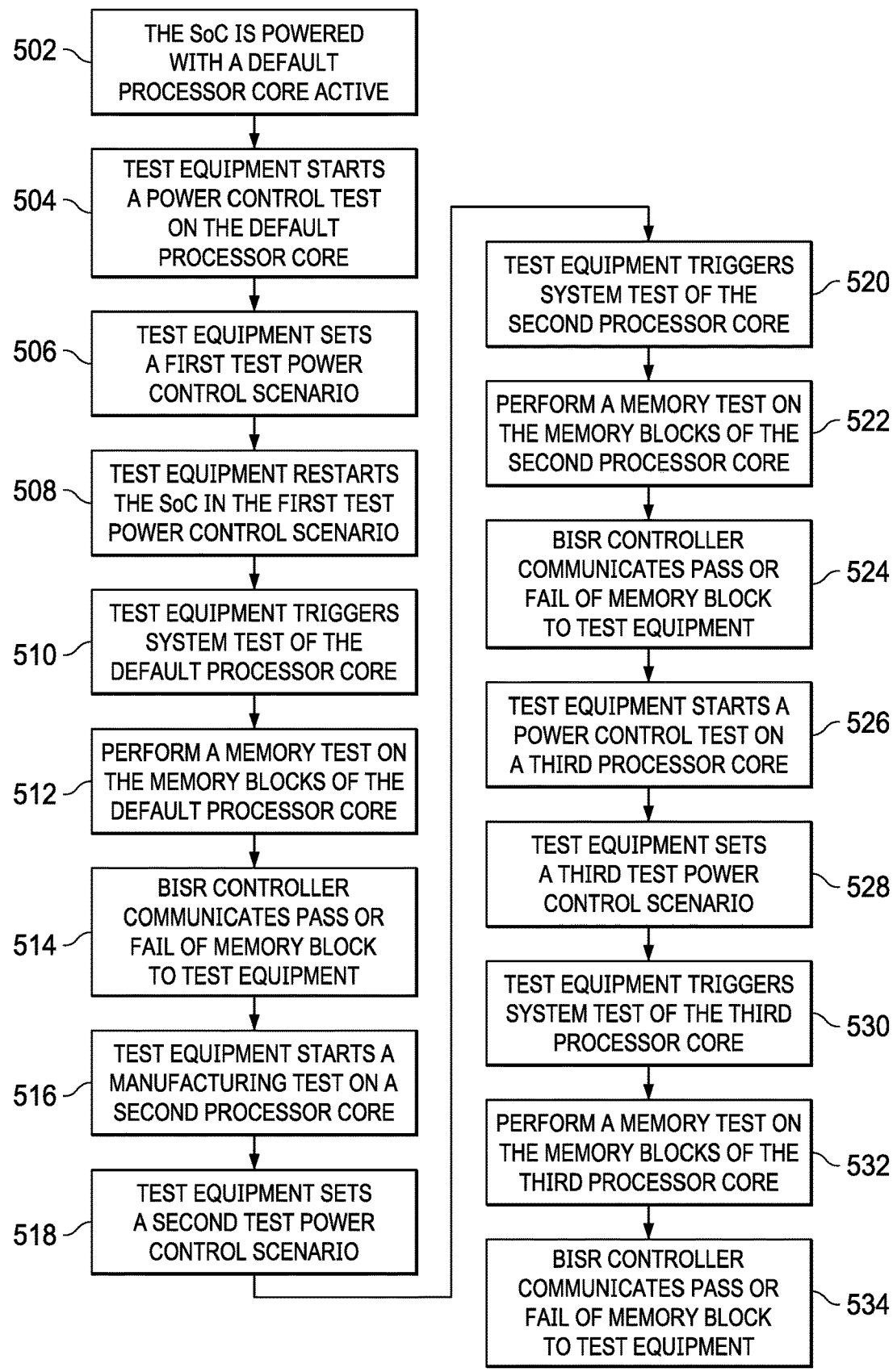
FIG. 5 is a flow diagram illustrating a manufacturing test of an integrated circuit in accordance with various examples.

FIG. 5 is a flow diagram illustrating a test method 500 on an integrated circuit in accordance with various examples. In an example, the test method 500 illustrates performing a manufacturing test on an integrated circuit with a BIST architecture, which in an example, is BIST architecture 400 that includes CPU 202, DSP 204, and GPU 206 of SoC 402 that was shown in FIG. 4. In an example, test method 500 is implemented using one or more test power control scenarios that sets test conditions on the SoC 402 during BIST testing of the SoC 402 by the BISR controller 210.

With continued reference to FIG. 4, in step 502, the SoC 402 is powered ON with a default core active. In an example, the default core is, in an example, CPU 202, however, other processor cores may be configured to be the default core. In an example, the SoC 402 is powered ON with the CPU 202 executing instructions that perform functional operations while DSP 204 and GPU 206 are not active (e.g., not executing functional operations).

In step 504, test equipment 426 starts a manufacturing test on the default processor core. In an example, the test equipment 426 runs a manufacturing test on CPU 202 whereby the test equipment 426 executes instructions for setting test conditions for implementing BIST testing on the SoC 402.

In step 506, test equipment 426 sets a first test power control scenario for the default processor core of SoC 402. In an example, test equipment 426 may set a test power control scenario for CPU 202 (e.g., default processor core) by applying power gating signals and clock gating signals to memory blocks of the CPU 202, DSP 204, and GPU 206 via BISR controller 210 that set one or more test conditions on the memory blocks of the CPU 202, DSP 204, and GPU 206.

In an example, test equipment 426 instructs BISR controller 210 to send isolation control signals to DSP isolation circuitry 216 that cause output values/states of logic gates in a memory blocks of DSP 204 that receive the isolation signal to be at logic output value that is a safe value (e.g., turn ON DSP BISR isolation) and to prevent logic gates in the memory block of DSP 204 from switching output states when power is applied to the DSP 204.

In an example, test equipment 426 instructs BISR controller 210 to send power gating signals to DSP power control circuitry 222 to turn OFF power applied to the memory blocks of DSP 204 after turning ON DSP BISR isolation.

In an example, test equipment 426 instructs BISR controller 210 to send isolation control signals to GPU isolation circuitry 218 via BIST datapath 208 to turn ON BISR isolation of GPU 206 (e.g., turn ON GPU BISR isolation), which cause output states of logic gates in the memory blocks of GPU 206 to be at a safe value such that when power is removed from the DSP 204 that follows GPU BISR isolation, leakage power does not increase.

In an example, test equipment 426 instructs BISR controller 210 to send power gating signals to GPU power control circuitry 224 to turn OFF power applied to the memory blocks of GPU 206 after turning ON GPU BISR isolation.

In step 508, test equipment 426 restarts the SoC 402 in the test power control scenario. In an example, the test equipment 426 sends commands/signals to CPU 202, DSP 204, and GPU 206 to restart the processor cores with the test power control scenario.

In step 510, test equipment 426 ends instructions to trigger a manufacturing test of the default processor core on SoC 402. In an example, the safety controller 212 may instruct the BISR controller 210 to send control commands to CPU 202 to execute a manufacturing test according to one or more BIST program routines by sending commands/signals to the BISR controller 210.

In step 512, BISR controller 210 performs a manufacturing test on the memory blocks of the default processor core. In an example, BISR controller 210 performs a fine-grained manufacturing test on the memory blocks $M_{1\_CPU}$-$M_{N\_CPU}$ within CPU 202 based on BIST program routines that are stored in and executed by CPU 202. In an example, for a fine-grained system test, the BISR controller 210 may dynamically clock gate memory blocks not-under-test to turn OFF clock signals to the non-tested memory blocks while a memory block under test is being tested via one or more BIST program routines. The BIST program routines include performing various operations (e.g., write and read) to serially test the memory blocks $M_{1\_CPU}$-$M_{N\_CPU}$ to determine whether one or more memory blocks $M_{1\_CPU}$-$M_{N\_CPU}$ has a parametric fault or a random defect based on an expected output of the memory blocks $M_{1\_CPU}$-$M_{N\_CPU}$.

In step 514, the BISR controller 210 sends a pass/fail determination to test equipment 426. In an example, BISR controller 210 obtains a pass/fail determination for each memory block $M_{1\_CPU}$-$M_{N\_CPU}$ of CPU 202 over BIST datapaths 203 and 208 based on BIST data for the memory blocks $M_{1\_CPU}$-$M_{N\_CPU}$. In an example, the BISR controller 210 sends the pass/fail determination to test equipment 426 via BIST datapath 208.

In step 516, test equipment 426 starts a manufacturing test on a second processor core. In an example, the test equipment 426 runs a manufacturing test on DSP 204 by sending instructions for implementing BIST testing of the DSP 204.

In step 518, test equipment 426 sets a second test power control scenario for DSP 204 of the SoC 402.

In an example, test equipment 426 may set the second test power control scenario for DSP 204 by instructing BISR controller 210 to apply clock gating signals to BIST datapath 203 via BIST datapath 208 that turn OFF clock signals to CPU 202 (e.g., clock gating CPU 202) in order to prevent logic gates in the memory block of CPU 202 from switching output states.

In an example, test equipment 426 instructs BISR controller 210 to send isolation control signals to DSP isolation circuitry 216 via BIST datapath 208 that turn OFF BISR isolation to DSP 204 (e.g., turn OFF DSP BISR isolation) whereby logic gates on DSP 204 may be at any output value/state.

In an example, test equipment 426 instructs BISR controller 210 to send power control signals to DSP power control circuitry 222 that turn ON power applied to DSP 204 after turning OFF DSP BISR isolation.

In an example, the test equipment 426 instructs BISR controller 210 to send isolation control signals to GPU isolation circuitry 218 via BIST datapath 208 that causes output values/states of logic gates in a memory blocks of GPU 206 that receives the isolation signal to be at logic output value that is a safe value (e.g., turn ON GPU BISR isolation).

In an example, test equipment 426 instructs BISR controller 210 to send power gating signals to GPU power control circuitry 224 to turn OFF power applied to the memory blocks of GPU 206 after turning ON GPU BISR isolation.

In an example, after power gating GPU 206, test equipment 426 may enable fine-grained clock gating on memory blocks $M_{1\_DSP}$-$M_{N\_DSP}$ of DSP 204 by instructing the BISR controller 210 to perform dynamic clock gating of each memory block among the memory blocks $M_{1\_DSP}$-$M_{N\_DSP}$ so as to obtain pass-fail determination of one or more memory cells in each memory block when a manufacturing test is performed.

In step 520, test equipment 426 triggers a manufacturing test of the second processor core of SoC 201. In an example, test equipment 426 may trigger the BISR controller 210 to send control commands to DSP 204 to execute a manufacturing test on the memory blocks of DSP 204 using fine-grained tuning according to one or more BIST program routines by sending commands/signals to the BISR controller 210.

In step 522, BISR controller 210 performs a manufacturing test on the memory blocks of the second processor core. In an example, the BISR controller 210 performs a fine-grained manufacturing test on the memory blocks $M_{1\_DSP}$-$M_{N\_DSP}$ within DSP 204 based on BIST program routines that are stored in and executed by DSP 204. In an example, for a fine-grained system test, test equipment 426 may dynamically clock gate memory blocks not-under-test to turn OFF clock signals to the non-tested memory blocks while a memory block under test is being tested via one or more BIST program routines. The BIST program routines include performing various operations (e.g., write and read) to serially test the memory blocks $M_{1\_DSP}$-$M_{N\_DSP}$ to determine whether one or more memory blocks $M_{1\_DSP}$-$M_{N\_DSP}$ has a parametric fault or a random defect based on an expected output of the memory blocks $M_{1\_DSP}$-$M_{N\_DSP}$.

In step 524, BISR controller 210 sends a pass/fail determination to test equipment 426. In an example, BISR controller 210 obtains a pass/fail determination for each memory block $M_{1\_DSP}$-$M_{N\_DSP}$ of DSP 204 over BIST datapaths 203 and 208 BIST data for the memory blocks $M_{1\_DSP}$-$M_{N\_DSP}$ and sends the pass/fail determination to test equipment 426.

In step 526, test equipment 426 starts a manufacturing test on a third processor core. In an example, the test equipment 426 runs a manufacturing test on GPU 206 whereby the test equipment 426 executes instructions for implementing BIST testing of the GPU 206.

In step 528, test equipment 426 sets a third test power control scenario for GPU 206 of the SoC 402. In an example, test equipment may set the third test power control scenario for GPU 206 by instructing BISR controller 210 to apply isolation control signals to GPU isolation circuitry 218 via BIST datapath 208 that turn OFF GPU BISR isolation.

In an example, test equipment 426 instructs BISR controller 210 to send power control signals to GPU power control circuitry 224 that turn ON power applied to GPU 206 after turning OFF GPU BISR isolation.

In an example, the test equipment 426 instructs BISR controller 210 to send clock gating signals to BIST datapath 203 via BIST datapath 208 that turn OFF clock signals that are applied to CPU 202 (e.g., clock gating CPU 202).

In an example, test equipment 426 instructs BISR controller 210 to send isolation control signals to DSP isolation circuitry 216 that turn ON DSP BISR isolation.

In an example, test equipment 426 instructs BISR controller 210 to send power gating signals to DSP power control circuitry 222 that turn OFF power applied to the memory blocks of DSP 204 after turning ON DSP BISR isolation In an example, after power gating DSP 204, test equipment 426 may enable fine-grained clock gating on memory blocks $M_{1\_GPU}$-$M_{N\_GPU}$ of GPU 206 by instructing the BISR controller 210 to perform dynamic clock gating of each memory block among the memory blocks $M_{1\_GPU}$-$M_{N\_GPU}$ and obtain pass-fail determination of each memory block during a system test which reduces test power during BIST testing.

In step 530, test equipment 426 triggers a manufacturing test of the third processor core of SoC 402. In an example, test equipment 426 may trigger the BISR controller 210 to send control commands to GPU 206 to execute a manufacturing test according to one or more BIST program routines by sending commands/signals to the BISR controller 210.

In step 532, BISR controller 210 performs a manufacturing test on the memory blocks of the third processor core. In an example, BISR controller 210 performs a fine-grained manufacturing test on the memory blocks $M_{1\_GPU}$-$M_{N\_GPU}$ within GPU 206 based on BIST program routines that are stored in and executed by GPU 206. In an example, for a fine-grained system test, test equipment 426 may dynamically clock gate memory blocks in $M_{1\_GPU}$-$M_{N\_GPU}$ that are not-under-test to turn OFF clock signals to the non-tested memory blocks while a memory block under test in $M_{1\_GPU}$-$M_{N\_GPU}$ is being tested via one or more BIST program routines. The BIST program routines include performing various operations (e.g., write and read) to serially test the memory blocks $M_{1\_DSP}$-$M_{N\_DSP}$ to determine whether one or more memory blocks $M_{1\_GPU}$-$M_{N\_GPU}$ has a parametric fault or a random defect based on an expected output of the memory blocks $M_{1\_GPU}$-$M_{N\_GPU}$.

In step 534, BISR controller 210 sends a pass/fail determination to test equipment 426. In an example, BISR controller 210 receives BIST data for each memory block $M_{1\_GPU}$-$M_{N\_GPU}$ of GPU 206 over BIST datapaths 203 and 208 and obtains a pass/fail determination for the memory blocks $M_{1\_GPU}$-$M_{N\_GPU}$ using the BIST data. In an example, the BISR controller 210 sends the pass/fail determination to test equipment 426.

Figure 6:
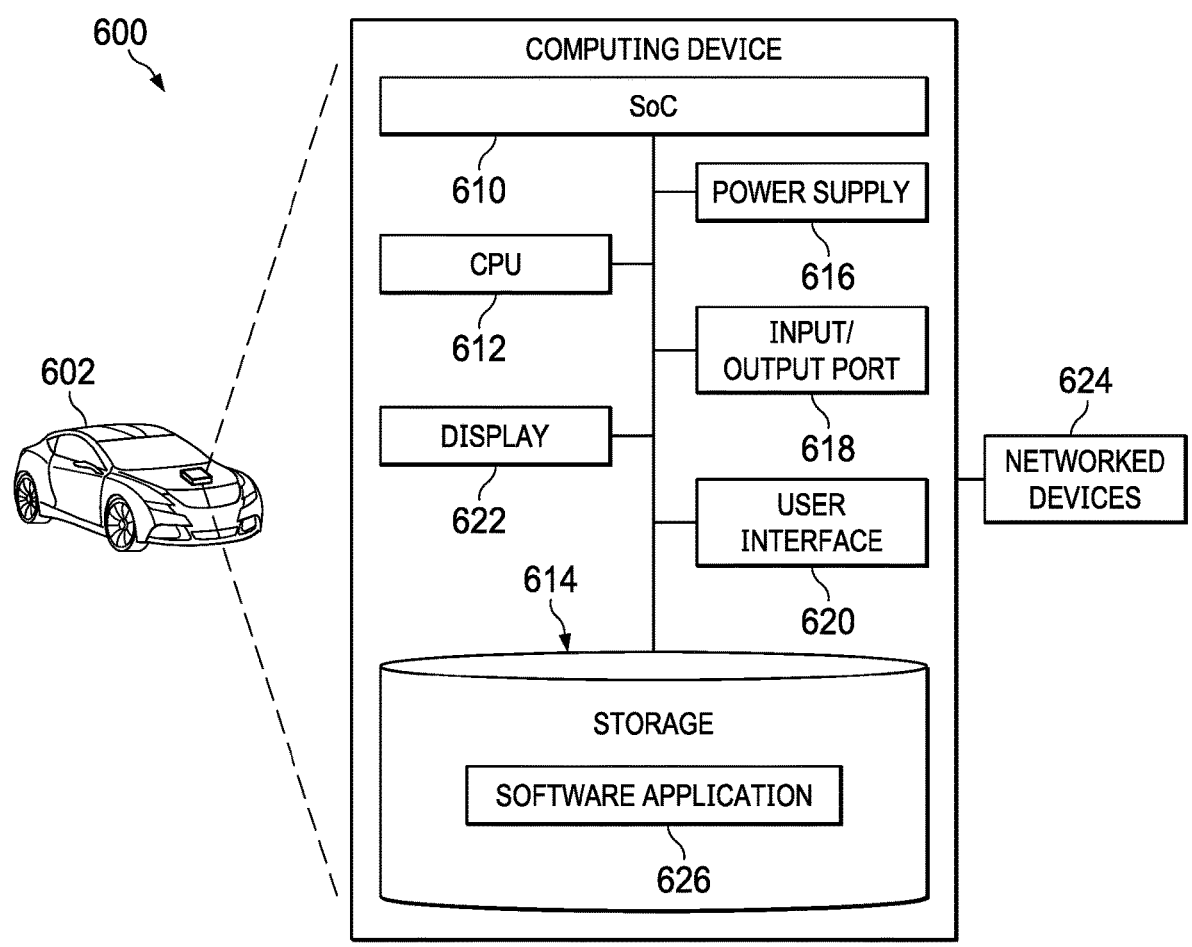
FIG. 6 is a block diagram of a computing device in accordance with various examples.

FIG. 6 is a block diagram of a computing device 600 in accordance with various examples. For example, the computing device 600 is, or is incorporated into, or is coupled (e.g., connected) to a system, such as an automobile 602, or any type of electronic system operable to process information. In some examples, computing device 600 includes a SoC 610, a central processing unit (CPU) 612, storage 614 (e.g., a random-access memory (RAM)), power supply 616, input-output (I/O) port 618, user interface (UI) 620, display 622, and networked devices 624.

In some examples, the SoC 610 is SoC 100 that was described in FIG. 1 and may be programmed to implement a test power control scenario on the embedded memory blocks of SoC 610.

In examples, CPU 612 is a CISC-type (complex instruction set computer) CPU, RISC-type (reduced instruction set computer) CPU, MCU-type (microcontroller unit), or a digital signal processor (DSP). CPU 612 comprises one or more processor cores. The one or more processor cores are arranged to execute code for transforming the one or more processors into a special-purpose machine or improving the functions of other components in computing device 600 to provide a desired output without performing similar operations on the one or more other processor cores. CPU 612 comprises memory and logic that store information frequently accessed from storage 614.

In some examples, storage 614 is memory such as on-processor cache, off-processor cache, RAM, flash memory, or disk storage for storing one or more software applications 626 (e.g., embedded application), that when executed by CPU 612, performs functions associated with computing device 600 that are described herein.

In an example, a user controls computing device 600 using UI 620. In an example, during execution of software application 626, a user provides inputs to computing device 600 via UI 620, and receives outputs from computing device 600. In examples, the outputs are provided via display 622, indicator lights, a speaker, vibrations and the like. The input is received using audio and/or video inputs (using, e.g., voice or image recognition), and electrical and/or mechanical devices such as keypads, switches, proximity detectors, gyros, accelerometers, and the like.

CPU 612 and power supply 616 are coupled to I/O port 618. In an example, I/O port 618 provides an interface that is configured to receive input (and/or provide output t) networked devices 624. Networked device 624 can include any device (including test equipment) capable of point-to-point and/or networked communications with computing device 600. Computing device 600 is often coupled to peripherals and/or computing devices, including tangible, non-transitory media (such as flash memory) and/or cabled or wireless media. These and other input and output devices are selectively coupled to the computing device 600 by external devices using wireless or cabled connections. Storage 614 is accessible, for example, by networked devices 624. The CPU 612, storage 614, and power supply 616 are also optionally coupled to an external power supply (not shown), which is configured to receive power from a power source (such as a battery, solar cell, "live" power cord, inductive field, fuel cell, capacitor, and the like).

In an example, power supply 616 is in the same physical assembly as computing device 600, or is coupled to computing device 600. While not shown in FIG. 6, power supply 616 includes power generating components. Power generating components include one or more power switches. Each of the switches is independently controlled for generating power to supply power at various power-saving modes whereby individual voltages are supplied (and/or turned off) by the power switches in accordance with a selected power-saving mode and the various components arranged within a specific power domain.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. While certain components may be described herein as being of a particular process technology, these components may be exchanged for components of other process technologies. Circuits described herein are reconfigurable to include the replaced components to provide functionality at least partially similar to functionality available prior to the component replacement.

What is claimed is:

1. An integrated circuit, comprising:
   a set of processor cores, wherein each processor core of the set of processor cores comprises:
   built-in self-test (BIST) logic circuitry; and
   multiple memory blocks coupled to the BIST logic circuitry;
   multiple power control circuitry, wherein each power control circuitry of the multiple power control circuitry is coupled to a respective processor core of the set of processor cores;
   multiple isolation circuitry, wherein each isolation circuitry of the multiple isolation circuitry is coupled to a respective processor core of the set of processor cores; and
   a built-in-self repair (BISR) controller coupled to each processor core of the set of processor cores, to each power control circuitry of the multiple power control circuitry, and to each isolation circuitry of the multiple isolation circuitry, wherein the BISR controller is configured to:
   receive multiple test power control scenarios that are associated with BIST memory testing of the set of processor cores, wherein the multiple test power control scenarios comprise a hierarchical order of applying one or more test power control scenarios to the set of processor cores;
   dynamically apply, according to the hierarchical order, the one or more test power control scenarios on the set of processor cores;
   perform BIST memory testing of at least one memory block of the multiple memory blocks associated with each processor core of the set of processor cores; and
   receive a result of the BIST memory testing.

2. The integrated circuit of claim 1, further comprising a safety controller coupled to the BISR controller, wherein the BISR controller is configured to:
   receive the multiple test power control scenarios that are associated with BIST memory testing of the set of processor cores from the safety controller; and
   send the result of the BIST memory testing to the safety controller.

3. The integrated circuit of claim 2, wherein the BISR controller is configured to:
   receive, from the safety controller, a first test power control scenario of the multiple test power control scenarios, wherein the first test power control scenario is associated with BIST memory testing of a first processor core of the set of processor cores according to the hierarchical order of applying the one or more test power control scenarios;

apply, according to the first test power control scenario, a clock gating signal to a second processor core of the set of processor cores;

cause, according to the first test power control scenario, an isolation control signal to be applied to a third processor core of the set of processor cores;

cause, according to the first test power control scenario, a power gating signal to be applied to the third processor core; and dynamically apply, according to the first test power control scenario, the clock gating signals to the first processor core.

4. The integrated circuit of claim 2, wherein the BISR controller is configured to receive, from the safety controller, the multiple test power control scenarios based on programmed instructions that are stored in the safety controller or that are obtained by the safety controller from a user interface coupled to the safety controller.

5. The integrated circuit of claim 2, wherein the BISR controller is configured to:

apply clock signals to a first memory block of multiple memory blocks of a first processor core of the set of processor cores;

remove clock signals to other memory blocks of the multiple memory blocks;

send instruction to perform the BIST memory testing of the first memory block; and send instruction to perform the BIST test of the other memory blocks according to the BIST memory testing of the first memory block and after performing the BIST memory testing of the first memory block.

6. The integrated circuit of claim 3, wherein the BISR controller is configured to:

receive, from the safety controller, a second test power control scenario of the multiple test power control scenarios according to the hierarchical order of applying the multiple test power control scenarios, wherein the second test power control scenario is based on the BIST memory testing of a second processor core of the set of processor cores;

apply the second test power control scenario according to the hierarchical order of applying the one or more test power control scenarios; and cause the one or more memory blocks of the second processor core to be tested according to the BIST memory testing.

7. The integrated circuit of claim 6, wherein the BISR controller is configured to:

apply, according to the second test power control scenario, an isolation control signal to the second processor core;

apply, according to the second test power control scenario, a power gating signal to the second processor core;

send, according to the second test power control scenario, a second isolation control signal to a third processor core of the set of processor cores; and apply, according to the second test power control scenario, a second power gating signal to the third processor core.

8. The integrated circuit of claim 7, wherein the BISR controller is configured to receive instructions to perform the BIST memory testing of the one or more memory blocks of the first processor core upon rebooting the integrated circuit.

9. The integrated circuit of claim 2, wherein the BISR controller is configured to receive instruction to perform the BIST testing of one or more memory blocks of other processor cores of the set of processor cores according to the hierarchical order of applying the one or more test power control scenarios.

10. The integrated circuit of claim 2, whether the BISR controller is configured to perform the BIST testing responsive to a trigger signal received from the safety controller.

11. A method of executing built-in self-test (BIST) memory testing of an integrated circuit, comprising:

receiving, by a built-in-self repair (BISR) controller, multiple test power control scenarios from a safety controller, wherein the multiple test power control scenarios is associated with the BIST memory testing of a set of processor cores and comprises a hierarchical order of applying one or more test power control scenarios to the set of processor cores;

dynamically applying, by the BISR controller, the one or more test power control scenarios on the set of processor cores according to the hierarchical order;

performing, by a processor core of the multiple processor cores, the BIST memory testing of a memory block associated with each of the set of processor cores;

receiving, by the BISR controller, a result of the BIST memory testing of the memory block from the processor core; and sending, by the BISR controller, the result of the BIST memory testing to the safety controller.

12. The method of claim 11, further comprising:

receiving, by the BISR controller, a first test power control scenario of the multiple test power control scenarios from the safety controller, wherein the first test power control scenario is associated with the BIST memory testing of a first processor core of the set of processor cores according to the hierarchical order of applying the one or more test power control scenarios;

applying, by the BISR controller, a clock gating signal to a second processor core of the set of processor cores based on the first test power control scenario;

causing, by the BISR controller, an isolation control signal to be applied to a third processor core of the set of processor cores according to the first test power control scenario;

causing, by the BISR controller, a power gating signal to be applied to the third processor core according to the first test power control scenario; and dynamically applying, by the BISR controller, the clock gating signals to the first processor core according to the first test power control scenario.

13. The method of claim 12, further comprising receiving, by the BISR controller from the safety controller, the multiple test power control scenarios based on programmed instructions that are stored in the safety controller or that are obtained by the safety controller from a user interface coupled to the safety controller.

14. The method of claim 11, further comprising:

applying, by the BISR controller, clock signals to a first memory block of multiple memory blocks of a first processor core of the set of processor cores;

removing, by the BISR controller, clock signals to other memory blocks of the multiple memory blocks;

sending instruction, by the BISR controller, to perform the BIST memory testing of the first memory block; and sending instruction, by the BISR controller, to perform the BIST memory test of the other memory blocks according to the BIST memory test of the first memory block and after performing the BIST memory testing of the first memory block.

15. The method of claim 11 further comprising:
receiving, by the BISR controller, a second test power control scenario of the multiple test power control scenarios from the safety controller according to the hierarchical order of applying the one or more test power control scenario, wherein the second test power control scenario is based on the BIST memory testing of a second processor core of the set of processor cores;
applying, by the BISR controller, the BIST memory testing of the second processor core based on the second test power control scenario; and
testing, one or more memory blocks of the second processor core according to the BIST testing.

16. The method of claim 15, further comprising:
applying, by the BISR controller, an isolation control signal to the second processor core of the set of processor cores based on the second test power control scenario;
applying, by the BISR controller, a power gating signal to the second processor core based on the second test power control scenario;
sending, by the BISR controller, a second isolation control signal to a third processor core of the set of processor cores based on the second test power control scenario; and
applying, by the BISR controller, a second power gating signal to the third processor core based on the second test power control scenario.

17. The method of claim 16, further comprising receiving instructions, by the BISR controller, to perform the BIST memory testing of the memory blocks of the set of processor cores upon rebooting the integrated circuit.

18. The method of claim 11, further comprising receiving instruction, by the BISR controller, to perform the BIST memory testing of one or more memory blocks of other processor cores of the set of processor cores according to the hierarchical order of the applying the multiple test power control scenarios.

19. The method of claim 11, further comprising receiving instruction, by the BISR controller, to perform the BIST memory testing responsive to receiving a trigger signal from the safety controller.

20. The method of claim 11, further comprising receiving instruction, by the BISR controller, to perform the BIST memory testing responsive to receiving a trigger signal from test equipment.

* * * * *